(12) United States Patent
Chang et al.

(10) Patent No.: US 11,369,036 B2
(45) Date of Patent: Jun. 21, 2022

(54) ANTI-REFLOW COVER FOR A COMPUTER SYSTEM COMPONENT MODULE

(71) Applicant: Quanta Computer Inc., Taoyuan (TW)

(72) Inventors: Chun Chang, Taoyuan (TW);
Chih-Hao Chang, Taoyuan (TW);
Yi-Fu Liu, Taoyuan (TW);
Ching-Cheng Kung, Taoyuan (TW)

(73) Assignee: QUANTA COMPUTER INC., Taoyuan (TW)

(*) Notice: Subject to any disclaimer, the term of this patent is extended or adjusted under 35 U.S.C. 154(b) by 26 days.

(21) Appl. No.: 17/099,274

(22) Filed: Nov. 16, 2020

(65) Prior Publication Data

US 2022/0071051 A1 Mar. 3, 2022

Related U.S. Application Data

(60) Provisional application No. 63/071,166, filed on Aug. 27, 2020.

(51) Int. Cl.
*H05K 7/20* (2006.01)
*G06F 1/20* (2006.01)
*G06F 1/18* (2006.01)

(52) U.S. Cl.
CPC ......... *H05K 7/20145* (2013.01); *G06F 1/181* (2013.01); *G06F 1/20* (2013.01); *H05K 7/20727* (2013.01)

(58) Field of Classification Search
CPC ........... H05K 7/20145; H05K 7/20727; H05K 7/20618; H05K 7/20178–20736; G06F 1/20
See application file for complete search history.

(56) References Cited

U.S. PATENT DOCUMENTS

| | | | |
|---|---|---|---|
| 10,154,606 B1* | 12/2018 | Liu | H05K 7/1487 |
| 10,212,842 B1* | 2/2019 | Schulze | H05K 7/1452 |
| 10,631,432 B2* | 4/2020 | Gopalakrishna | H05K 7/20181 |
| 11,006,543 B2* | 5/2021 | Huangfu | H05K 7/1489 |
| 2011/0053485 A1* | 3/2011 | Huang | H05K 7/20736 454/184 |
| 2012/0120559 A1* | 5/2012 | Ewing | H02B 1/565 361/622 |
| 2012/0162904 A1* | 6/2012 | Chan | G06F 1/20 361/679.48 |
| 2012/0162913 A1* | 6/2012 | Lai | H05K 7/20727 165/96 |
| 2015/0070830 A1* | 3/2015 | Iwasaki | H05K 7/1487 361/679.33 |

(Continued)

Primary Examiner — Stephen S Sul
(74) Attorney, Agent, or Firm — Nixon Peabody LLP

(57) ABSTRACT

A component housing insertable in a chassis for a computing device blocking air flow when in a pulled out position is disclosed. The component housing has a front end and an opposite rear end. A pair of side walls are provided between the front end and the rear end. The side walls are slidably connected to the chassis to allow the component housing to be moved between an inserted position and the pulled-out position. A cover on the rear end has an open position allowing air flow through the rear end when the component housing is in the inserted position. The cover has a closed position blocking air flow through the aperture when the component housing is in the pulled out position.

16 Claims, 7 Drawing Sheets

(56) References Cited

U.S. PATENT DOCUMENTS

| | | | |
|---|---|---|---|
| 2015/0296657 A1* | 10/2015 | Veino | H05K 7/20145 165/96 |
| 2020/0253077 A1* | 8/2020 | Zhai | G11B 33/128 |
| 2020/0323106 A1* | 10/2020 | Peng | H05K 7/20145 |
| 2020/0344908 A1* | 10/2020 | Liu | H05K 7/1489 |
| 2021/0410314 A1* | 12/2021 | Chen | H05K 7/1487 |

* cited by examiner

ANTI-REFLOW COVER FOR A COMPUTER SYSTEM COMPONENT MODULE

CROSS-REFERENCE TO RELATED APPLICATIONS

This patent application claims the priority under 35 U.S.C. § 119 to U.S. Provisional Application No. 63/071,166, filed Aug. 27, 2020. The contents of that application in its entirety are hereby incorporated by reference.

TECHNICAL FIELD

The present disclosure relates generally to systems and methods for optimizing thermal performance in computing devices. More particularly, aspects of this disclosure relate to a cover for a modular component holder to block air reflow when the component holder is pulled out from a chassis and channeling airflow when the component holder is inserted.

BACKGROUND

Computing systems (e.g., desktop computers, blade servers, rack-mount servers, etc.) are employed in large numbers in various applications. High demand applications, such as network based systems, data centers, or high density finite element simulations, can push hardware of computing systems, causing excess heat to be generated by the hardware of the computing systems. For example, a hard-drive of a server, memory modules installed in the server, and processors of the server, etc., operating at high capacity can generate excess heat. Heat generated by computing systems is generally dissipated to avoid damage or performance degradation of such components in the computing systems. For example, excessive heat can melt interconnects of fragile electronics or can damage substrates of these electronics.

Thermal management is an important aspect of optimizing the performance of a computing system. Thermal management can be performed at component level, for example, at the level of computing system components that can heat up. Central processing units (CPUs), graphics processing units (GPUs), and dual in-line memory modules (DIMMs) are examples of components usually considered when performing component level thermal management. Other systems such as a fan wall of fan modules may be used to circulate air throughout the computer system.

Networked computer devices such as servers often include a chassis with high heat generation components such as power supply, processors, and memories. Additional functions may be added with a modular housing holding components such as hard disk drives (HDDs) to increase storage capacity. As server operation is critical, such modular housings are designed so they can be serviced without the server being taken off line or removed from the rack. For example, modular component housings are designed to be pulled out from the chassis while the processor and other components of the server continue to operate.

However, pulling out a modular component housing from a chassis will alter the cooling air flow in the chassis. FIG. 1A shows a cross section of a prior art server 10 having a chassis 12. The chassis 12 is generally rectangular, having a front end 14 that is installed facing outward from the front of the rack. The front end includes features that allow technicians to service the server 10, and connectors that allow connections through cables. An opposite rear end 16 includes power connections, but is less accessible as it is designed for being accessed at the rear of a rack. The server 10 includes a motherboard 20 that holds processing components such as a processor and an attached heat sink 22 as well as signal input/output components 24. A fan wall 26 having multiple fan modules provides air flow as shown by arrows 28. The fan wall 26 draws air from the front end 14 to the rear end 16 to provide cooling to the interior of the chassis 12. A power supply or power supplies 30 provides power to the components of the chassis 12.

The chassis 12 is designed to hold a modular component housing 40. The modular component housing 40 has side walls and a bottom panel. In this example, the modular component housing 40 includes large numbers of storage devices such as HDDs 42 that are supported by the bottom panel and side walls. Thus, the modular component housing 40 provides additional storage for the server 10. The modular component housing 40 may be pulled out from the front end 14 of the chassis 12 via a handle 44. The top of the modular component housing 40 is generally open to allow access to the HDDs 42. When the modular component housing 40 is pulled out from the chassis 12 and thus the rack, an operator may access the storage devices 42 while the components on the motherboard 20 remain powered and operating as they remain in stationary position in the chassis 12 on the rack.

A front end of the modular component housing 40 is generally flush with the front end 14 of the chassis 12 when the modular housing 40 is inserted fully. An opposite rear end of the modular housing 40 is generally open. As shown, the airflow represented by arrows 28 also flows through the modular component housing 40 to provide roughly the same volume of cooling to the HDDs 42 as to the components on the motherboard 20 such as the processor and heat sink 22.

FIG. 1B shows a cross section of an example airflow interference in the prior art server 10 in FIG. 1A when the modular component housing 40 is pulled out from the chassis 12. Like elements are labeled with identical reference numerals as their counterparts in FIG. 1A. When the modular component housing 40 is pulled out from the chassis 12, a large space 50 is created from the open top side of the modular component housing 40. Air flow, as shown with arrows 52, is diverted through the large space 50 and directed toward the open rear end of the modular component housing 40 since this constitutes a lower impedance path than that directed toward the motherboard 20. Thus, greater volumes of airflow are directed from the top of the server chassis 12 by the pulled out modular component housing 40. The variation in impedance structures due to the positioning of the component housing 40 causes airflow bypass and reduces the efficiency of the fan wall 26 in cooling the processor and other components on the motherboard 20. Since airflow is diminished to the components on the motherboard 20, full operation of such components is impeded.

Thus, there is a need for a mechanism that allows air flow to be maintained in a computer system housing even when a component module is pulled out. There is a need for mechanism that maintains airflow normally when a component module is inserted in a computing system chassis. There is a need for a mechanism that allows multiple modular housings to be pulled out without impeding cooling air flow.

SUMMARY

One disclosed example is a component housing insertable in a chassis for a computing device for blocking air flow when in a pulled out position. The component housing has a front end and an opposite rear end. A pair of side walls are provided between the front end and the rear end. The side walls are slidably connected to the chassis to allow the component housing to be moved between an inserted position and the pulled out position. A cover on the rear end has an open position allowing air flow through the rear end when the component housing is in the inserted position. The cover has a closed position blocking air flow through the aperture when the component housing is in the pulled out position.

A further implementation of the example component housing is an embodiment where electronic components are mounted between the side walls. Another implementation is where the component housing includes a bottom panel joining the side walls. Another implementation is where the electronic components are hard disk drives. Another implementation is where the electronic components are arranged in a first group accessible from the front end of the housing, and a second group in proximity to the first group accessible from the top of the housing. Another implementation is where the front end of the component housing includes a handle. Another implementation is where the component housing includes a spring arm rotating between the open and closed position. The housing includes a spring mounted on the spring arm. The spring has a first end connected to the housing, and a second end contacting the cover. The spring biases the cover in the closed position. Another implementation is where the component housing includes a slot formed in one of the side walls. The slot engages a pin extending from an interior surface of the chassis to rotate the spring arm to the open position when the component housing is inserted in the chassis. Another implementation is where the computing device is a rack-mounted server. The server maintains operation when the component housing is in the pulled out position.

Another disclosed example is a computing system having a chassis with two side walls, a top wall, and a bottom wall that defines a front end and a rear end. A fan module generates air flow from the front end to the rear end of the chassis. The computing system has a first component housing including a front end, an opposite rear end, and a pair of side walls between the front end and the rear end. The side walls slidably connect to the side walls of chassis to allow the component housing to be moved between an inserted position and a pulled out position from the front end of the chassis. The housing includes a cover on the rear end. The cover has an open position allowing air flow through the rear end when the first component housing is in the inserted position. The cover has a closed position blocking air flow through the rear end when the first component housing is in the pulled out position.

A further implementation of the example computing system is an embodiment including a motherboard in the chassis under the first component housing. The computing system includes a processor on the motherboard. The processor remains operational when the first component housing is in the pulled-out position. Another implementation is where the computing system includes a second component housing having a front end, an opposite rear end, and a pair of side walls between the front end and the rear end. The side walls slidably connect to the side walls of chassis to allow the second component housing to be moved between an inserted position and a pulled-out position from the front end of the chassis. The second housing includes a cover on the rear end. The cover has an open position allowing air flow through the rear end when the second component housing is in the inserted position. The cover has a closed position blocking air flow through the rear end when the second component housing is in the pulled-out position. Another implementation is where the first computing housing further includes electronic components mounted between the side walls. Another implementation is where the electronic components are hard disk drives. Another implementation is where the electronic components are arranged in a first group accessible from the front of the first component housing, and a second group in proximity to the first group accessible from the top of the first component housing. Another implementation is where the front end of the first component housing includes a handle. Another implementation is where the first component housing further includes a spring arm rotating between the open and closed position. The first component housing also includes a spring mounted on the spring arm. The spring has a first end connected to the housing, and a second end contacting the cover. The spring biases the cover in the closed position. Another implementation is where the first component housing includes a slot formed in one of the side walls. The slot engages a pin extending from an interior surface of the chassis to rotate the spring arm to the open position when the first component housing is inserted in the chassis.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of embodiments together with reference to the accompanying drawings.

Figure 1A:
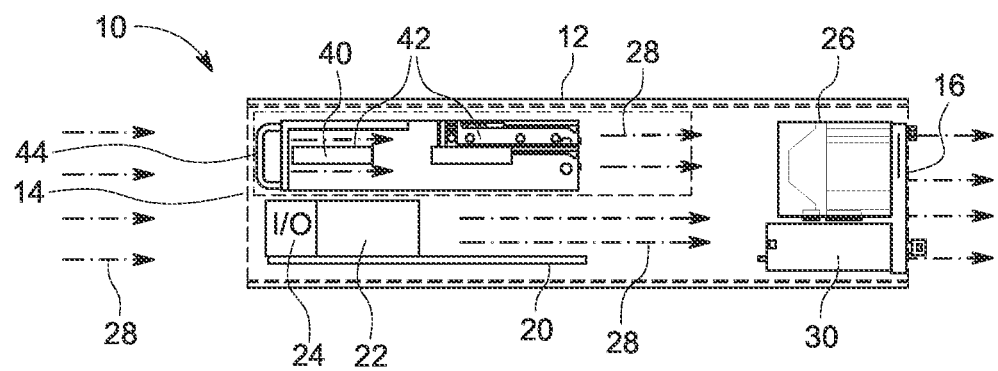
FIG. 1A is a cross section view of a prior art server chassis with an inserted modular component housing, showing air flow.
Figure 1B:
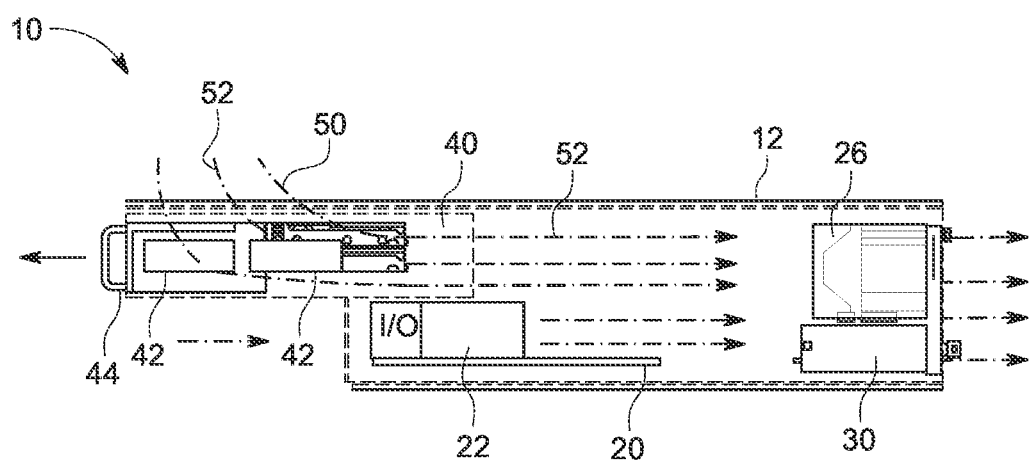
FIG. 1B is a cross-section view of the prior art server chassis in FIG. 1A, showing airflow diversion when the modular component housing is pulled out of the chassis.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure relates to a rear cover flap for a removable modular component housing that is installed in a server chassis. The modular component housing may be pulled out of a computing device chassis to allow service of components in the housing while the server remains mounted in a rack and powered-up. The dummy cover allows protection from thermal damage of the internal components of the server while the component housing is pulled out. The cover blocks air flow, and thus air flow is directed efficiently to cool the components of the server. This design can reduce the airflow bypass in the system. The design may be used with any modular housing for different standard chassis sizes such as 1U, 2U or 4U sized server chassis types.

Figure 2A:
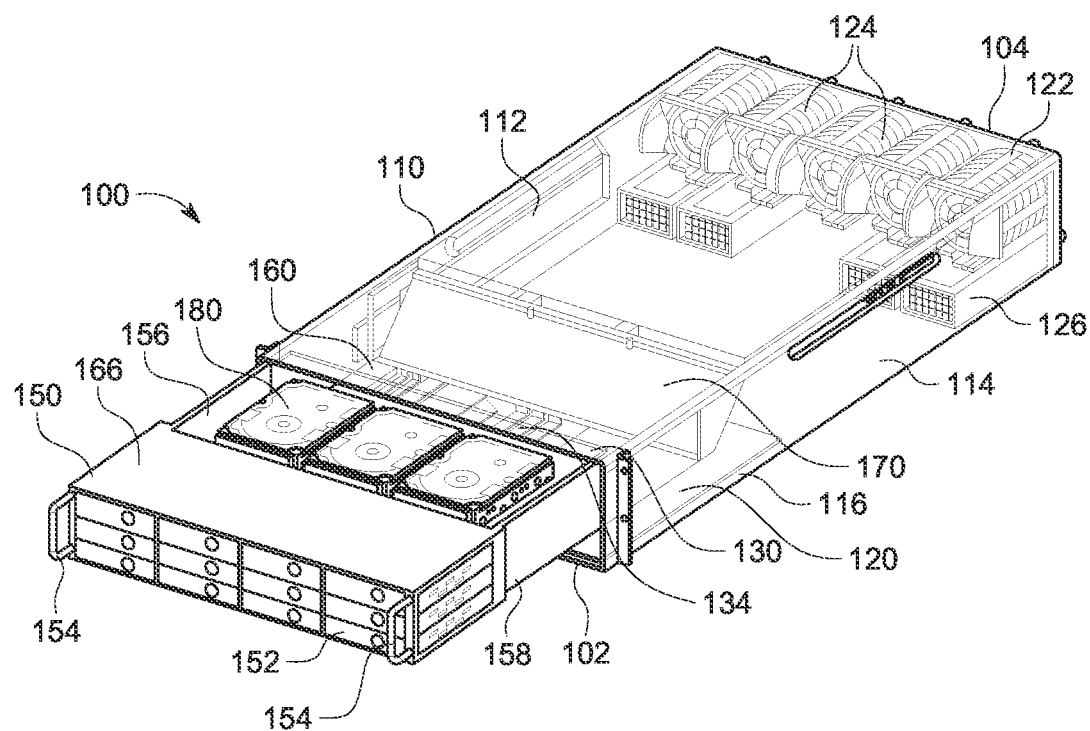
FIG. 2A is a perspective view of a rack mounted server and a modular component housing with the example anti-reflow cover.
Figure 2B:
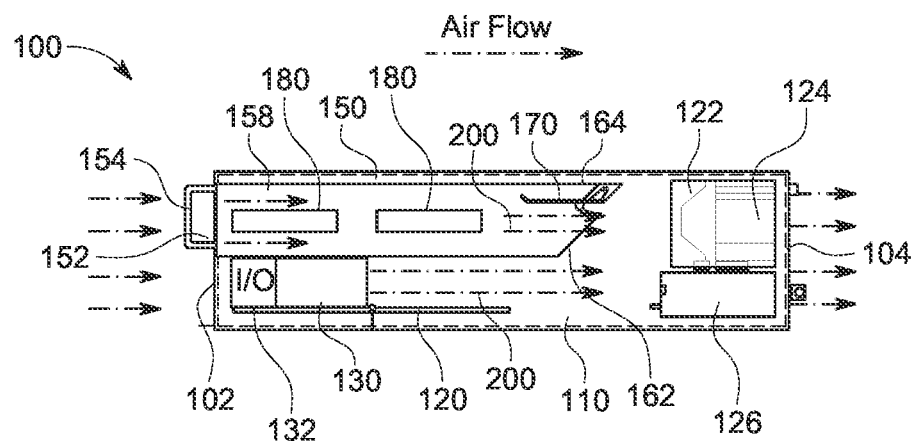
FIG. 2B is a cross-section view of the example chassis showing air flow when the modular component housing is inserted in the chassis.
Figure 2C:
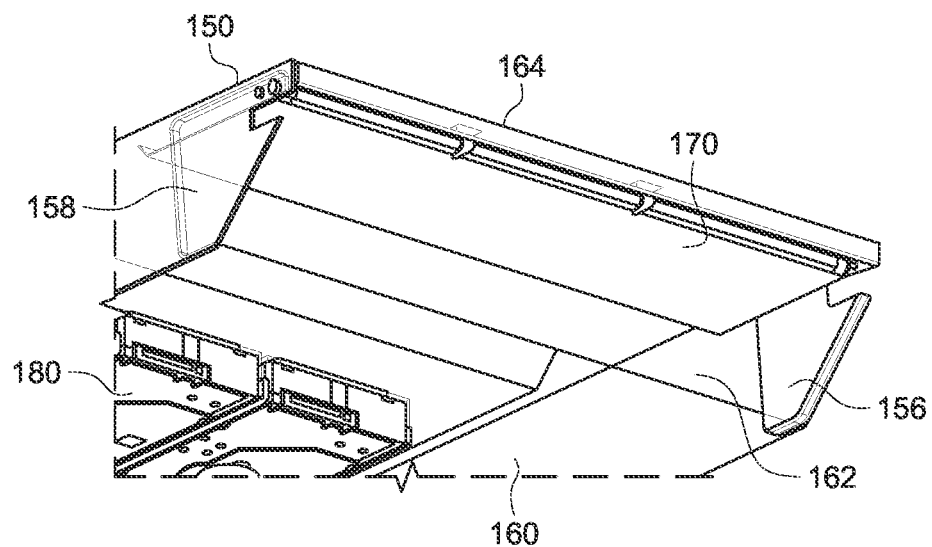
FIG. 2C is a close up of the cover at the rear of the modular component housing in the open position.

FIG. 2A is a perspective view of a computing device such as a rack-mounted server 100. FIG. 2B is a cross-section view of the server 100. FIG. 2C is a close up perspective view of the modular component housing allowing air flow in the server 100. As shown in FIGS. 2A-2C, the server 100 has a front end 102 and a rear end 104. The front end 102 is at the front of the rack when the server 100 is installed in a slot in the rack and is generally designed to allow frequent service functions while the server 100 remains in the rack such as cable connectors. The rear end 104 includes connections that generally require less service such as power connectors.

The server 100 includes a chassis 110 with two side walls 112 and 114. The side walls 112 and 114 are joined by a bottom panel 116. A motherboard 120 is mounted between the side walls 112 and 114. The motherboard 120 is fixed between the front end and the rear end of the chassis 110. A fan wall 122 that includes fan modules 124 is located near the rear of the chassis 110. The fan wall 122 generates air flow between the side walls 112 and 114 to assist in cooling the components of the server 100. A series of power supplies 126 and supporting components such as voltage regulators are located near the rear end 104 of the chassis 110.

The motherboard 120 includes one or more components including processors such as CPUs, network interface cards, memory devices, and the like. In this example, the motherboard 120 includes processors that are each attached to a heat sink 130. Interface circuits 132 (FIG. 2B) are installed near the front of the motherboard 120 to receive data signals from connectors near the front 102 of the chassis 110. The motherboard 120 also includes dual in line memory modules (DIMMs) 134 near the processors for rapid memory. The components on the motherboard 120 generate heat when in operation and requires air flow generated by the fan wall 122 for cooling.

Incoming air flow enters through the front end 102 of the chassis 110 of the server 100. The incoming air flow passes through components in the chassis 110, resulting in an outgoing air current, and exiting from the back end 104 of the chassis 110. The fan modules 124 of the fan wall 122 are configured to set a direction for the incoming air flow and the outgoing air flow, such that both the incoming air flow and the outgoing air current flow move in a same direction.

A modular component housing 150 can be inserted in the chassis 110 over the CPUs and components of the motherboard 120 as shown in FIGS. 2B-2C. As shown in detail in FIG. 2A, 3A-3C, the modular component housing 150 may be pulled out from the chassis 110.

The modular component housing 150 has a generally rectangular front frame 152 with side handles 154 that may be used to pull out the housing 150 from the chassis 110. The housing 150 includes side walls 156 and 158 and a bottom panel 160. The bottom edges of both side walls 156 and 158 are joined to the bottom panel 160. The front ends of the side walls 156 and 158 are attached to the sides of the rectangular front frame 152. The exteriors of the side walls 156 and 158 include registration features that allow the housing 150 to be supported above the motherboard 120 when the housing 150 is inserted in the chassis as shown in FIG. 2A-2C. The registration features also guide the housing 150 when the housing 150 is pulled out as shown in FIG. 3A.

As shown in FIG. 2C, the back ends of the side walls 156 and 158 and the back end of the bottom panel 160 define an open rear end 162 of the housing 150. A rear connector panel 164 joins part of the side walls 156 and 158 near the rear end 162 of the housing 150. A front connector panel 166 (FIG. 2A) joins part of the side walls 156 and 158 near the front frame 152. A rotating cover 170 is mounted on the rear of the side walls 156 and 158. Biasing assemblies on the rear of the walls 156 and 158 allow the cover 170 to be rotated to a closed position to block the open rear end 162, as shown later in FIGS. 3B-3C. The cover 170 may be rotated to an open position to allow air flow through the open rear end 162 shown in FIGS. 2B-2C.

The modular component housing 150 may hold different electronic components in the space defined by the side walls 156 and 158, and the bottom panel 160. In this example, the modular component housing 150 may hold up to 24 hard disk drives (HDD)s 180, as shown in FIG. 3A. Other numbers of electronic components of different types and sizes such as circuit boards, PCIe type form factor devices, and other storage devices such as solid state drives (SSD)s may be stored in the modular component housing 150. FIG. 3A is a close up perspective view of the modular component housing 150 in a pulled-out position from the chassis 110. FIG. 3B is a cross-section view of the chassis 110 showing airflow being diverted when the modular component housing 150 is pulled out from the chassis 110. FIG. 3C is a close-up perspective view of the cover 170 at the rear of the modular component housing 150 in the closed position, blocking air.

Figure 3A:
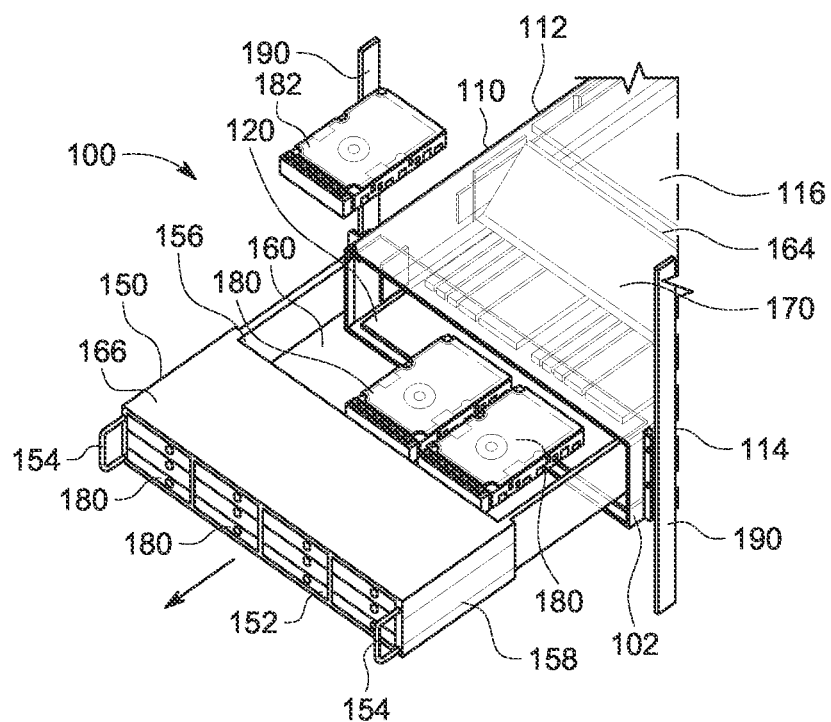
FIG. 3A is a close up perspective view of the modular component housing in a pulled-out position from the chassis in FIG. 2A.
Figure 3B:
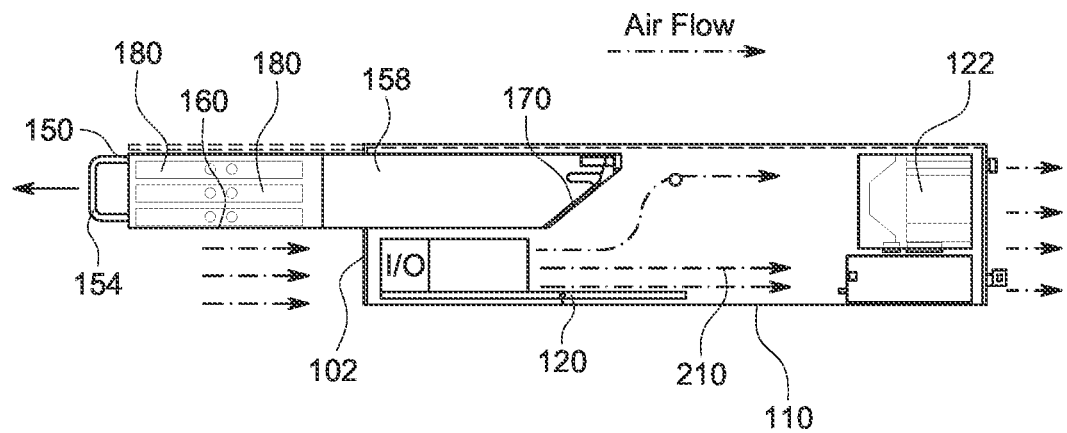
FIG. 3B is a cross-section view of the example chassis showing airflow being diverted when the modular component housing is pulled out from the chassis.
Figure 3C:
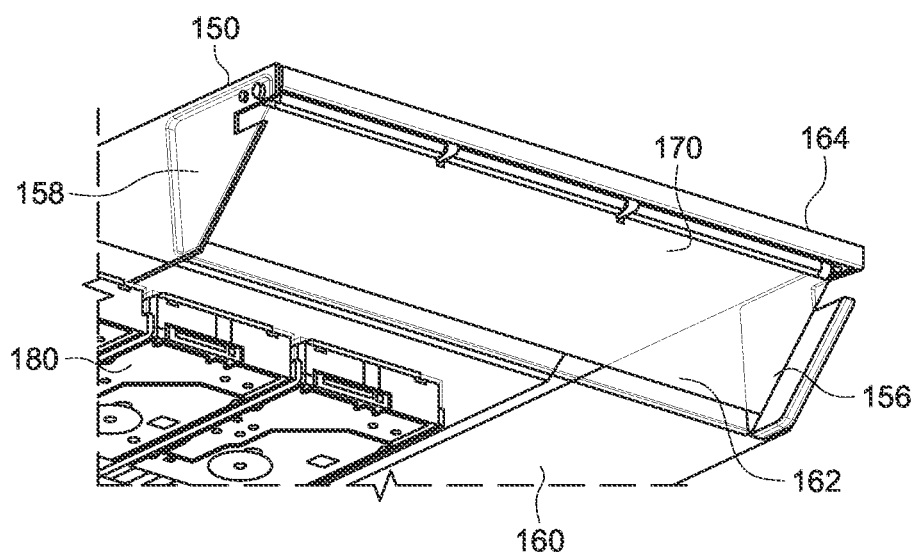
FIG. 3C is a close up perspective view of the cover at the rear of the modular component housing in the closed position blocking air.

As shown in FIG. 3A, one group of twelve HDDs 180 is arranged in three rows and four columns across the width of the front frame 152 under the front connector panel 166. In this example, the front frame 152 includes apertures to allow status LEDs of the HDDs 180 to be viewable from the front of the chassis 110. Alternatively, the HDDs 180 in this group may be removed from through the front frame 152 while the modular component housing 150 is inserted in the chassis 110.

A second group of twelve HDDs 180 is arranged in three rows and four columns behind the first group of HDDs 180. The top edges of the walls 156 and 158, the front connector 166, and the connector panel 164 define an open top space allowing a user to remove and replace HDDs 180 in the second group. Rather than removing such components from the front of the housing 150, the housing 150 may be pulled out from the chassis 110, and a user may remove the components such as a HDD 182 shown in FIG. 3A, from the open top space of the modular housing 150.

While the modular housing 150 is pulled out from the chassis 110, the chassis 110 remains in the rack as represented by vertical mounting flanges 190. The server 100 thus may continue to operate while the modular housing 150 is pulled out as shown in FIG. 3A.

Referring back to FIG. 2B, while the modular component housing 150 is inserted in the chassis 110, air flow is generated by the fan modules of the fan wall 122 through the component housing 150 and also over the motherboard 120. Air flow is generated to take air through the front frame 152 of the component housing 150 to cool the HDDs 180. As will be explained, the cover 170 is biased to rotate to an open position proximate the connector panel 164. Air will thus flow through the open rear end 162 of the component housing 150. In this arrangement, the air flow generated by the fan wall 122 provides cooling for both the components in the modular component housing 150 and the components on the motherboard 120 as shown by arrows 200. The computing system 100 therefore reaches a state of thermal equilibrium meaning all components will not exceed their operating temperatures.

As shown in FIG. 3A-3C, when the modular component housing 150 is pulled out of the chassis 110, the cover 170 is rotated into a closed position. The cover 170 thus covers the open rear end 162 of the housing 150. The open top space of the housing 150 allows a user to access the second group of HDDs 180 behind the front group of HDDs 180. Air flow through the open top of the housing 150 is blocked by the cover 170. Thus, air is only taken in through the bottom part of the front end 102 of the chassis 110. Thus, air flow represented by arrows 210 generated by the fan wall 122 is largely channeled to cool the components on the motherboard 120.

During the normal operation of the server 100, the cover 170 will be rotated to allow air flow through the rear end 162 of the component housing 150. When the component housing 150 is pulled out for servicing components, the cover 170 will be rotated to a closed position by the biasing mechanism to prevent air flow through the rear end 162 of the component housing 150. The resulting air flow allows optimal operation of the components on the motherboard 120 and other components in the chassis 110. This arrangement also behaves as the air duct mechanism that can reduce airflow bypass since the airflow is directed primarily under the pulled out component housing 150 and directly over the motherboard 120. The cover 170 in the closed position will divert airflow coming off of the motherboard 120 away from the components on the motherboard 120.

Figure 4A:
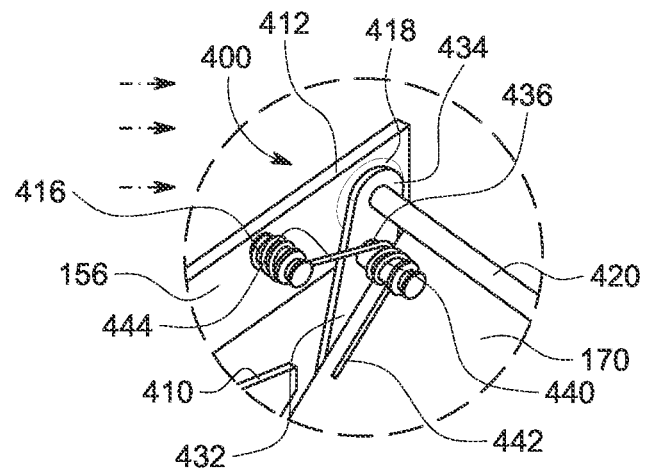
FIG. 4A is a close-up perspective view of the example cover biasing mechanism of the modular component housing in FIG. 3A.
Figure 4B:
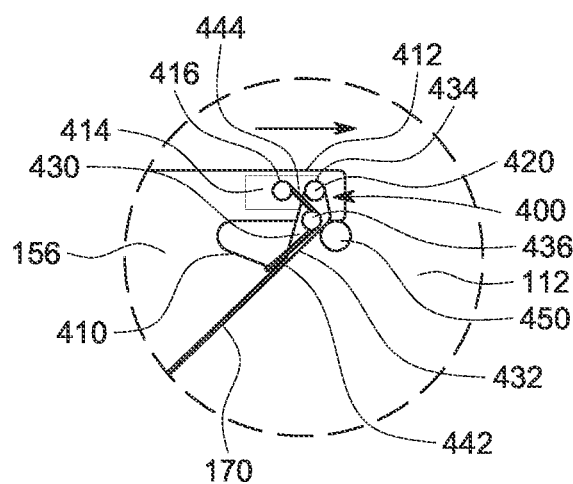
FIG. 4B is a close-up side view of the example cover biasing mechanism when the cover is rotated to the closed position to block air flow.
Figure 4C:
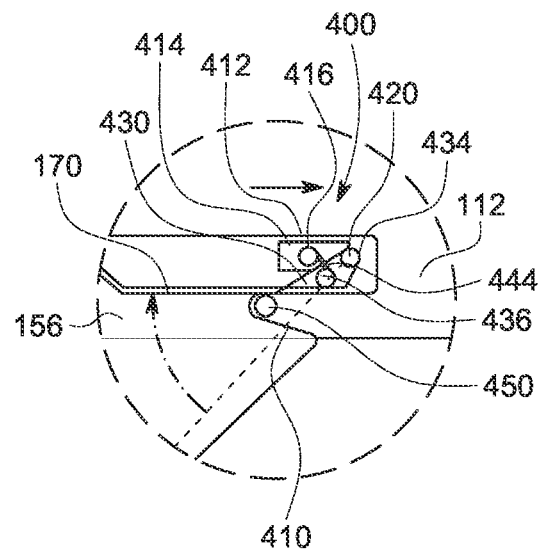
FIG. 4C is a close-up side view of the example cover biasing mechanism when the cover is rotated to the open position allow air flow.

FIG. 4A is a close-up perspective view of an example cover biasing assembly 400 on the side wall 156 of the modular component housing 150 in FIGS. 3A-3B. An identical biasing assembly is supported by the side wall 158 of the modular component housing 150. FIG. 4B is a close-up side view of the example cover biasing assembly 400 when the cover 170 is rotated to the closed position to block air flow. FIG. 4C is a close-up side view of the example cover biasing assembly 400 when the cover 170 is rotated to the open position to allow air flow. The biasing assembly 400 moves the cover 170 between the open and closed positions explained above.

As seen in FIGS. 4B-4C, the rear edge of the side wall 156 is formed at an angle. A slot 410 having an open end and a closed end is cut into the rear edge of the side wall 156. A support arm 412 defines the top of the slot 410. The biasing assembly 400 is supported on the distal end of the support arm 412. The interior surface of the support arm 412 includes a depression 414. A spring pin 416 extends out from the depression 414.

The distal end of the support arm 412 includes a mounting hole 418. A shaft 420 is inserted into mounting hole 418. The shaft 420 is attached to one end of the cover 170 and rotates in the mounting hole 418. A spring arm 430 has an edge 432 that is attached to the side of the cover 170. The spring arm 430 includes a hole 434 that is attached to the shaft 420 so the spring arm 430 rotates with the shaft 420. The spring arm 430 supports a lateral rod 436 that extends from the side of the spring arm 430. A spring 440 is wound around the lateral rod 436. An end 442 of the spring 440 is in contact with the surface of the cover 170. An opposite end 444 of the spring is wrapped around the spring pin 416.

The spring force of the spring 440 forces the spring arm 430 to rotate the shaft 420 in a counter clockwise motion as viewed in FIGS. 4B-4C. The shaft 420 in turn rotates the cover 170 in the closed position in FIG. 4B. Thus, when the component housing 150 is pulled out of the chassis 110 (in FIG. 3A-3C), the spring 440 urges the cover 170 in the closed position, preventing air flow from the rear end 162 of the housing 150 as shown in FIGS. 3A-3C.

The side wall 112 of the chassis 110 includes an activation pin 450 that extends out from the interior surface of the side wall 112. The activation pin 450 is located near the rear end 162 of the housing 150 when the housing 150 is fully inserted in the chassis 110. A similar activation pin is located on the opposite side wall 114 of the chassis 110 to engage the other biasing assembly of the side wall 158 of the housing 150.

The activation pin 450 is located at a height matching that of the slot 410 of the side wall 156 of the housing 150. When the housing 150 is fully inserted in the chassis 110, the slot 410 will allow the activation pin 450 to be moved to the closed end of the slot 410 as shown in FIG. 4C. As the pin 450 moves from the open end of the slot 410 (shown in FIG. 4B) to the closed end of the slot 410, the pin 450 will contact the edge 432 of the spring arm 430. The pin 450 will urge the spring arm 430 to rotate in a clock-wise direction thereby counteracting the spring force of the spring 440. The rotation of the spring arm 430 in turn rotates the shaft 420 to rotate the cover 170 to the open position as shown in FIG. 4C. The pin 450 acts against the spring force of the spring 440 and fixes the cover 170 in the open position shown in FIG. 4C when the housing 150 is fully inserted in the chassis 110.

Figure 5A:
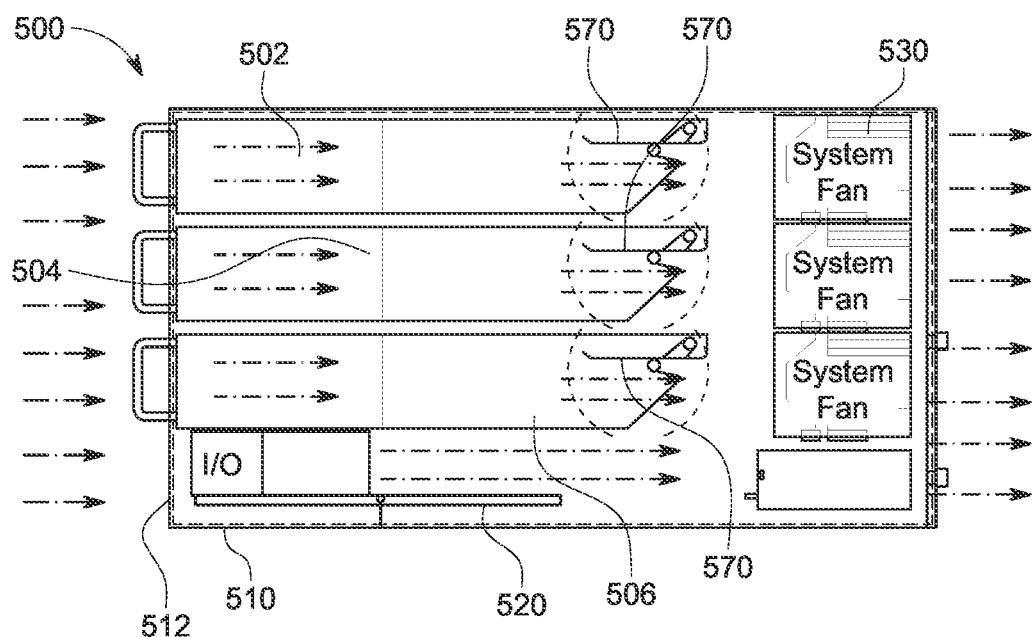
FIG. 5A is a cross-section view of a 2U type server with several modular component housings.

FIG. 5A is a cross-section view of a 2U sized server 500 with several module housings 502, 504, and 506. The server 500 includes a 2U height chassis 510 having a front end 512 that allows the module housings 502, 504 and 506 to individually be pulled out. The component housings 502, 504, and 506 are stacked on top of a motherboard 520 that includes components such as processors, DIMMs, and the like. A fan wall 530 including several fan modules is located near the rear end of the chassis 510 to generate air flow from the front end 512 to cool the components on the motherboard 520 and the modular component housings 502, 504, and 506.

Each of the modular component housings 502, 504, and 506 includes a rotatable rear cover 570 identical to the cover 170 described above in FIGS. 3 and 4. When the modular component housings 502, 504, and 506 are fully inserted in the chassis 510 as shown in FIG. 5A, the respective covers 570 are in the open position to allow air flow through each of the housings 502, 504, and 506. The cover biasing mechanisms close the respective covers to block air flow when any of the housings 502, 504, and 506 are in a pulled-out position. In this manner, the components in any of the module housings 502, 504, and 506 may be serviced without preventing air flow to the components on the motherboard 520.

Figure 5B:
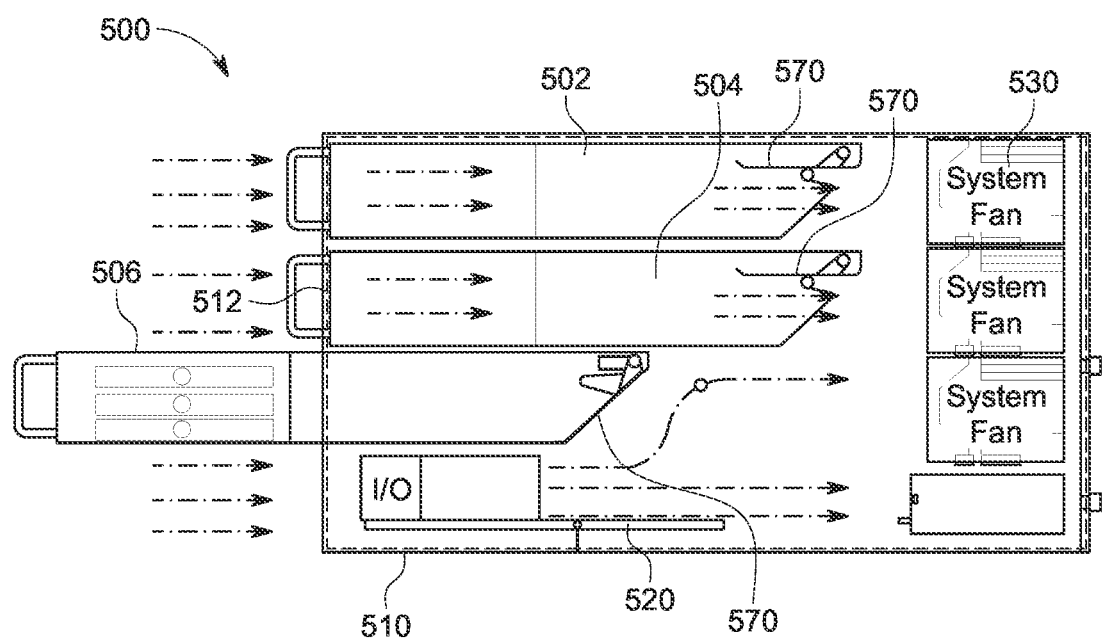
FIG. 5B is a cross-section view of the 2U type server with one of the modular component housings pulled out for service with the example cover blocking air reflow.

For example, FIG. 5B shows the server 500 in FIG. 5A with the modular component housing 506 in a pulled out position for service. Like elements in FIG. 5B are labeled with their like reference numbers in FIG. 5A. When the housing 506 is in the pulled-out position, the cover 570 is biased to the closed position to block air flow. Thus, air flow generated by the fan wall 522 continues at normal levels through the housings 502 and 504, and over the motherboard 520.

As used in this application, the terms "component," "module," "system," or the like, generally refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller, as well as the controller, can be a component. One or more components may reside within a process and/or thread of execution, and a component may be localized on one computer and/or distributed between two or more computers. Further, a "device" can come in the form of specially designed hardware; generalized hardware made specialized by the execution of software thereon that enables the hardware to perform specific function; software stored on a computer-readable medium; or a combination thereof.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application. Thus, the breadth and scope of the present invention should not be limited by any of the above described embodiments. Rather, the scope of the invention should be defined in accordance with the following claims and their equivalents.

What is claimed is:

1. A component housing insertable in a chassis for a computing device blocking air flow when in a pulled out position, the component housing comprising:
   a front end;
   an opposite rear end;
   a pair of side walls between the front end and the opposite rear end, the side walls slidably connected to the chassis to allow the component housing to be moved between an inserted position and the pulled out position;
   a cover on the opposite rear end, the cover having an open position allowing the air flow through the opposite rear end when the component housing is in the inserted position and a closed position blocking the air flow through the opposite rear end when the component housing is in the pulled out position;
   a spring arm rotating between the open and closed position of the cover; and
   a spring mounted on the spring arm, the spring having a first end connected to the component housing, and a second end contacting the cover, the spring biasing the cover in the closed position of the cover.

2. The component housing of claim 1, further comprising electronic components mounted between the side walls.

3. The component housing of claim 2, further comprising a bottom panel joining the side walls.

4. The component housing of claim 2, wherein the electronic components are one of hard disk drives, solid state drives, circuit boards, or PCIe devices.

5. The component housing of claim 2, wherein the electronic components are arranged in a first group accessible from the front end of the component housing and a second group in proximity to the first group accessible from a top of the component housing.

6. The component housing of claim 1, wherein the front end of the component housing includes a handle.

7. The component housing of claim 1, further comprising a slot formed in one of the pair of side walls, the slot engaging a pin extending from an interior surface of the chassis to rotate the spring arm to the open position when the component housing is inserted in the chassis.

8. The component housing of claim 1, wherein the computing device is a rack-mounted server, wherein the server maintains operation when the component housing is in the pulled out position.

9. A computing system comprising:
- a chassis having two side walls, a top wall and a bottom wall defining a front end and a rear end;
- a fan module generating air flow from the front end to the rear end of the chassis; and
- a first component housing including:
  - a front end;
  - an opposite rear end;
  - a pair of side walls between the front end and the rear end, the pair of side walls slidably connected to the side walls of the chassis to allow the component housing to be moved between an inserted position and a pulled out position from the front end of the chassis;
  - a cover on the opposite rear end, having an open position allowing the air flow through the opposite rear end when the first component housing is in the inserted position and a closed position blocking the air flow through the opposite rear end when the first component housing is in the pulled out position;
  - a spring arm rotating between the open and closed position of the cover; and
  - a spring mounted on the spring arm, the spring having a first end connected to the component housing, and a second end contacting the cover, the spring biasing the cover in the closed position of the cover.

10. The computing system of claim 9, further comprising:
- a motherboard in the chassis under the first component housing; and
- a processor on the motherboard, and wherein the processor remains operational when the first component housing is in the pulled out position.

11. The computing system of claim 9, further comprising a second component housing including:
- a front end;
- an opposite rear end;
- a pair of side walls between the front end and the opposite rear end, the pair of side walls slidably connected to the side walls of chassis to allow the second component housing to be moved between an inserted position and a pulled out position from the front end of the chassis;
- a cover on the opposite rear end, having an open position allowing air flow through the opposite rear end when the second component housing is in the inserted position and a closed position blocking air flow through the opposite rear end when the second component housing is in the pulled out position.

12. The computing system of claim 9, wherein the first component housing further includes electronic components mounted between the side walls of the first component housing.

13. The computing system of claim 12, wherein the electronic components are one of hard disk drives, solid state drives, circuit boards, or PCIe devices.

14. The computing system of claim 12, wherein the electronic components are arranged in a first group accessible from the front end of the first component housing and a second group in proximity to the first group accessible from a top of the first component housing.

15. The computing system of claim 9, wherein the front end of the first component housing includes a handle.

16. The computing system of claim 9, wherein the first component housing further includes a slot formed in one of the pair of side walls, the slot engaging a pin extending from an interior surface of the chassis to rotate the spring arm to the open position when the first component housing is inserted in the chassis.

\* \* \* \* \*